United States Patent [19]

Delagebeaudeuf et al.

[11] 4,186,407
[45] Jan. 29, 1980

[54] HETEROJUNCTION AVALANCHE DIODE WITH A TERNARY ALLOY OF GALLIUM, INDIUM AND ARSENIC, AND A BINARY ALLOY OF INDIUM AND PHOSPHORUS

[75] Inventors: Daniel Delagebeaudeuf; Thomas Pearsall, both of Paris, France

[73] Assignee: Thomson-CSF, Paris, France

[21] Appl. No.: 929,500

[22] Filed: Jul. 31, 1978

[30] Foreign Application Priority Data

Aug. 2, 1977 [FR] France .............................. 77 23779

[51] Int. Cl.$^2$ ............................................. H01L 29/90
[52] U.S. Cl. ........................................ 357/13; 357/16; 357/30; 357/61
[58] Field of Search .................... 357/16, 13, 30, 61

[56] References Cited

U.S. PATENT DOCUMENTS

| | | | |
|---|---|---|---|
| 3,982,261 | 9/1976 | Antypas | 357/16 |
| 4,017,332 | 4/1977 | James | 136/89 PC |
| 4,075,651 | 2/1978 | James | 357/22 |
| 4,083,062 | 4/1978 | Ohuchi | 357/13 |

*Primary Examiner*—Martin H. Edlow
*Attorney, Agent, or Firm*—Oblon, Fisher, Spivak, McClelland & Maier

[57] ABSTRACT

An avalanche diode comprising a semiconducting heterojunction (Ga$_x$In$_{1-x}$As/InP) intended to oscillate as an "IMPATT" diode. It comprises a substrate of n+ doped monocrystalline InP supporting a series of three layers which are formed by epitaxy and of which the monocrystalline latices match one another namely an InP layer with n-type doping and two layers of Ga$_x$In$_{1-x}$As (best mode: Ga$_{0.47}$In$_{0.53}$As) with n-type and p+-type doping respectively, these two layers being of minimal thickness. When a backward bias is applied to the p+n-junction, the avalanche phenomenon takes place in the thin n-type layer of ternary alloy.

7 Claims, 2 Drawing Figures

HETEROJUNCTION AVALANCHE DIODE WITH A TERNARY ALLOY OF GALLIUM, INDIUM AND ARSENIC, AND A BINARY ALLOY OF INDIUM AND PHOSPHORUS

This invention relates to an avalanche diode comprising a semiconducting heterojunction intended to oscillate in the so-called "transit time" mode. The generation of electromagnetic waves at very high frequencies in a diode of this type is of the "IMPATT" (*impact avalanche transit time*) combining the phenomenon of ionisation by impact with utilisation of the transit time of the charge carriers.

The theory behind the operation of these diodes shows the important role played by the ratio between the voltage drop in the avalanche zone and the global breakdown voltage in regard to the power output of the diode which is also known as the conversion efficiency.

According to the most elementary theory, the output would be proportional to the quantity:

$$1 - (VA/VO)$$

where VA and VO respectively represent the voltage in the avalanche zone and the global breakdown voltage.

It is already known that in heterojunctions of Ge/Ga As, there is a possibility of obtaining a value of from 0.7 to 0.8 for the quantity $1 - VA/VO$. This order of magnitude is comparable with that which is reached in structures with a GaAs homojunction which have a more or less complex doping profile and, hence, are more difficult and expensive to produce than simple heterojunction Ge/Ga As.

In the case of the Ge/Ga As heterojunction, the doping levels selected (of p-type for the germanium and of n-type for the gallium arsenide) are such that the ionisation by impact and the avalanche proper take place definitely in the germanium only in a region of minimal thickness.

Now, consideration of a pair of semiconductors formed respectively by a monocrystal of $Ga_xIn_{1-x}As$ ($0.4 < X < 0.7$) and by a monocrystal of In P reveals inter alia two facts which are favourable to the production of an avalanche diode of improved output by forming a heterostructure where the avalanche phenomenon is confined to one of the two monocrystals:

First fact: the concordance of the crystal lattices is perfect for $x = 0.47$ (and sufficient for $0.4 < X < 0.7$), which promotes the formation of the hererostructure by epitaxy;

Second fact: for two semiconducting layers consisting respectively of $Ga_xIn_{1-x}As$ and of In P, with the same doping levels, the avalanche voltage is approximately twice greater for In P than for $Ga_xIn_{1-x}As$ which, in practice, enables the avalanche zone to be confined to the region of $Ga_xIn_{1-x}As$; in addition, by reducing the doping level of In P, the breakdown voltage (in other words the theoretical avalanche voltage) of this material is further increased.

In addition, comparison of the electrical breakdown fields for Ge and $Ga_xIn_{1-x}As$, respectively, with a view to comparing this heterostructure with the preceding heterostructure, reveals a lower value for Ga In As throughout the range of doping levels suitable for use in practice, which is favourable to output in the case of $Ga_xIn_{1-x}As$.

According to the invention, there is provided an avalanche diode formed by a heterojunction between a ternary alloy of gallium, indium and arsenic and a binary alloy of indium and phosphorus, comprising a first layer of heavily doped ternary alloy having a first conductivity type, a second layer of weakly doped ternary alloy having a second conductivity type opposite to said first type, a third layer of weakly doped binary alloy having said second conductivity type and a substrate of heavily doped binary alloy having said second conductivity type.

Throughout the following, the exact composition of the ternary alloy is not critical and the dopings may be reversed (n instead of p) provided that, in this case, the direction of the bias applied to the diode is reversed.

The invention will be better understood and other features thereof will become apparent from the following description in conjunction with the accompanying drawings, wherein.

From various measurements carried out on the semiconductor materials (Ge, Ga, As, In P, Ga In As), it has been possible to formulate graphs giving the electrical breakdown field (the field which initiates an adequate impact ionisation for producing the avalanche phenomenon) in dependence upon the doping level. The level $N_D$ is recorded on the abscissa in FIG. 1, this level $N_D$ being the number of n-type doping impurities per cubic centimeter in the layer where the avalanche occurs (in this case the n-type layer of a p+n junction). The scale is logarithmic and is marked by the powers of ten of $N_D$ from $10^{15}$ at/cc. The electrical breakdown field $E_c$ (volts/cm) is recorded on the ordinate, being marked by the powers of ten from $5.10^4$ to $10^6$ V/cm.

Figure 1:
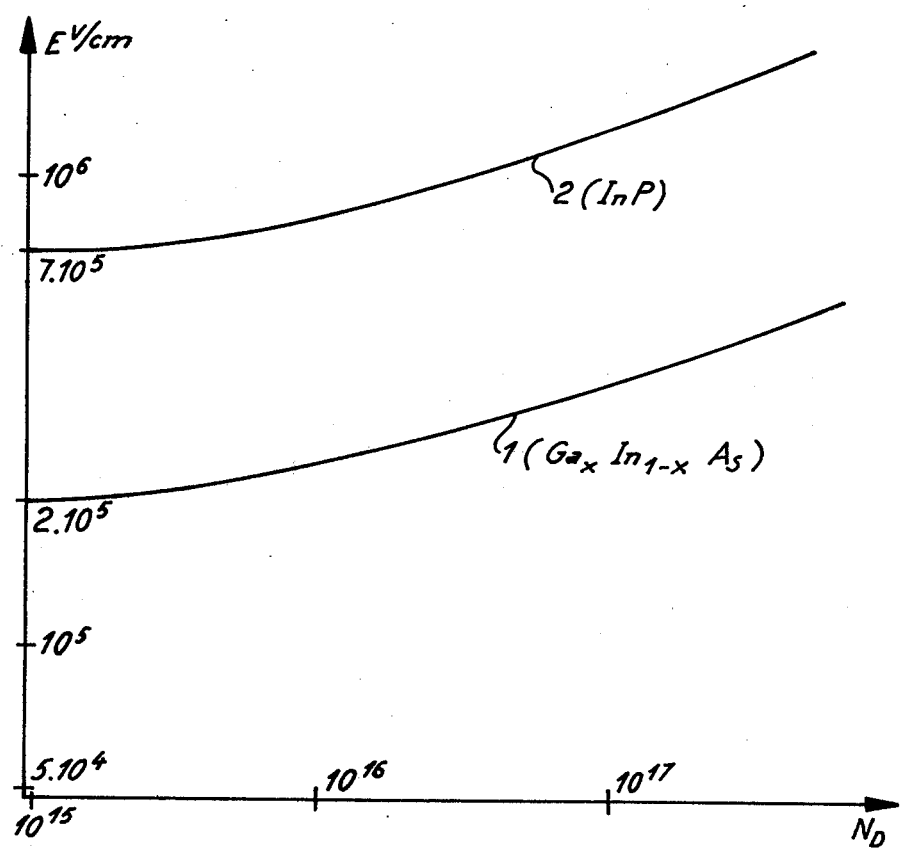
FIG. 1 is a diagramm of the critical electrical field of ionisation by impact of the semiconductor materials constituting the heterojunction according to the invention.

Curve 1 in FIG. 1 relates to the ternary alloy corresponding to the formula $Ga_{0.47}In_{0.53}As$. Curve 2 relates to the binary alloy corresponding to the formula In P. A similar increase in $E_c$ as a function of $N_D$ is observed in both cases, but at very different levels of $E_c$, the respective values of $E_c$ for a doping level of $10^{15}$ at/cc amounting to $2.10^5$ and $7.10^5$ V/cm.

It can be seen from FIG. 1 that, in a structure comprising the two materials at doping levels in the range from $10^{15}$ to $10^{17}$ at/cc, it is possible to adjust the biassing voltage at the terminals of the structure in such a way as to initiate the avalanche phenomenon in the Ga In As without any danger of the same phenomenon being simultaneously initiated in the material In P.

Figure 2:
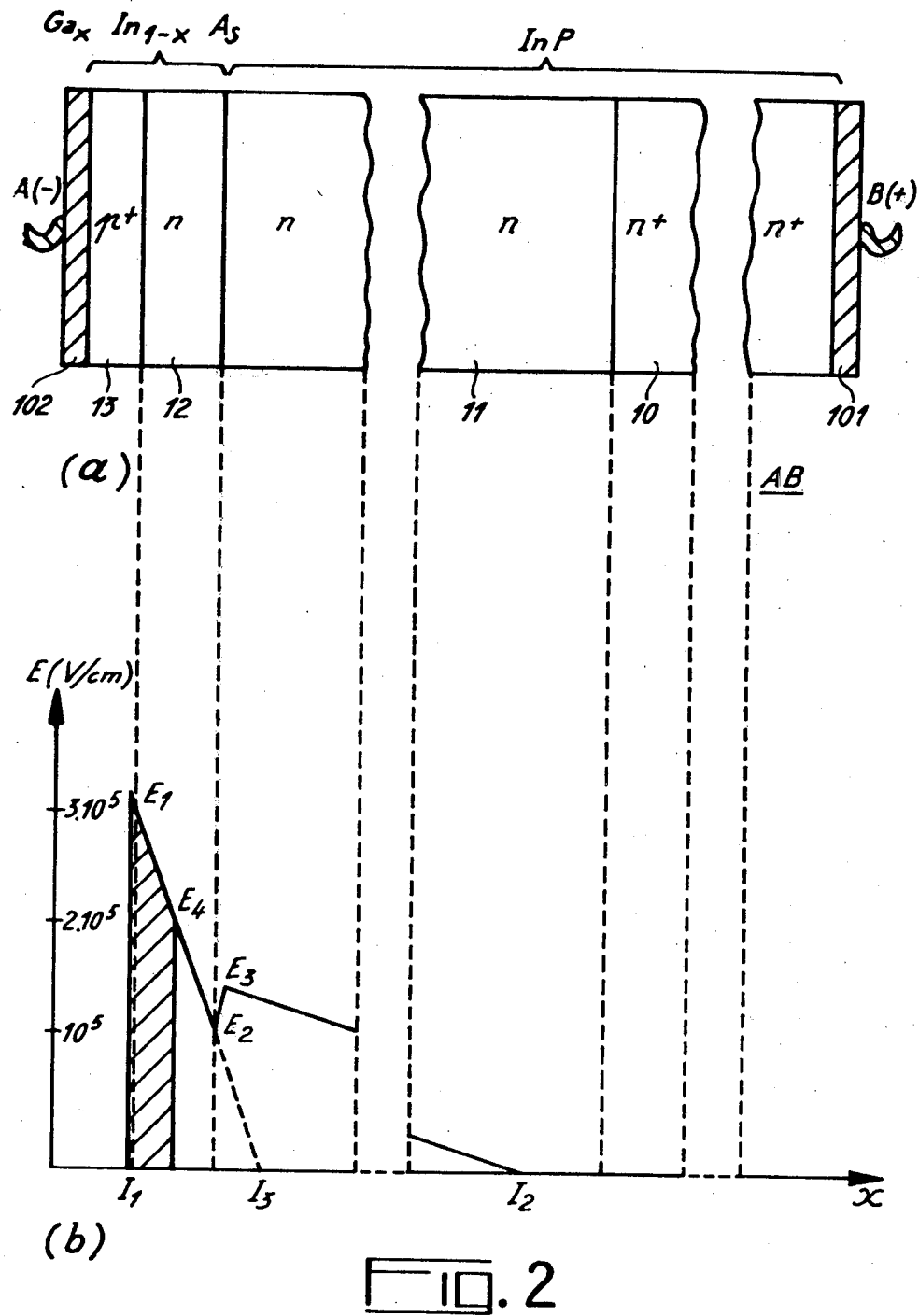
FIG. 2 shows in (a) a section through a diode according to the invention showing the various semiconducting layers by which it is formed, whilst in (b) an electrical field map associated with this section is illustrated.

As an example of a heterojunction structure, FIG. 2 shows in (a), the section of a diode AB comprising:

a part of monocrystalline binary alloy In P consisting of an n+-doped substrate 10 and an n-doped layer 11 formed by epitaxy on the substrate 10;

a part of monocrystalline ternary alloy $Ga_{0.43}In_{0.57}As$ consisting of an n-doped layer 12 adjacent the layer 11 and a p+-doped layer 13; these layers have been formed by the epitaxy of $Ga_{0.43}In_{0.57}As$ on the part of In P.

Metallisations are formed by a conventional method of vacuum deposition to obtain:

on the substrate side, a layer 101 of an alloy of gold, tin and tellurium;

on the p+-layer side, a layer 102 of an alloy of gold and zinc.

The thicknesses and the doping levels of the various layers and of the substrate are shown by way of example in the following Table, the thicknesses and doping levels indicated being particularly well suited to operation of the diode in the X-band, i.e at a frequency of the order of 10 GHz.

TABLE

| Reference in FIG. 2 | Nature of the layer or substrate | Doping level (at/cc) | Thickness (microns) |
|---|---|---|---|
| Layer 13 | $p^{30}$-doped $Ga_{0.47}In_{0.53}As$ | $4.10^{18}$ | 0.5 |
| Layer 12 | n-doped $Ga_{0.47}In_{0.53}As$ | $3.10^{16}$ | 0.5 |
| Layer 11 | n-doped In P | $2.10^{15}$ | 4 |
| Substrate 10 | n+-doped In P | $4.10^{18}$ | 150 à 300 |

Connections A(−) and B(+) are welded to the layers 102 and 101, respectively.

FIG. 2 shows in (b) an electrical field map in the semiconductor medium in the form of a diagram having two rectangular axes Ox, where the distances from the front face of the metallisation 102 in the direction from A towards B perpendicularly of the p+n junction are recorded, and OE where the electrical fields are measured.

With the diode biassed in the backward direction, as indicated by the references (−) and (+) of the connections A and B, the diagram is as follows at the beginning of breakdown. A broken line $I_1\ E_1\ E_2\ E_3\ I_2$ (drawn by interrupting the section $E_3\ I_2$ and the corresponding portion 11 of the semiconductor) comprises a set-back $E_2\ E_3$ at the separation suface of the layers 12 and 11. This set-back, which represents a break in the electrical field, arises from the difference in the respective permittivities of the two materials and from the application of Poisson's law. The following relation exists: $\epsilon_1\overline{E}_1 = -\epsilon_2\overline{E}_2$, wherein $\overline{E}_1$ and $\overline{E}_2$ represent the electrical fields.

Since the approximate values of $\epsilon_1$ and $\epsilon_2$ are 12 and 10.5, respectively $\overline{E}_3$ is approximately equal to 1.12 $\overline{E}_2$.

The hatched area in the layer 12 corresponds to the avalanche zone (this area being proportional to the avalanche voltage) and its thickness may be estimated as being of the order of one third of the length of the segment $I_1\ I_3$. The area between the broken line $E_4\ E_2\ E_3\ I_2$ and the axis Ox gives the voltage of the transit zone.

In the example described and illustrated, the avalanche voltage VA, i.e. effectively the voltage drop in the n-type layer of Ga In As, is of the order of 4.5 volts on breakdown by avalanche. This value is of the order of one third of the avalanche voltage in a similar diode made of Ga As which is favourable to output which, under these conditions, approaches 85%.

Among the advantages of the invention which have not yet been pointed out, reference is made to the following:

(a) a Gunn effect which is more pronounced in the In P than in the Ga As, which is favourable to good transit conditions for the group of charges issuing from the avalanche zone;

(b) the fact that the thermal conductivity of In P is greater than of Ga As which enables the theoretical dissipation to be increased and, for the same output, a higher maximum power to be delivered in the case of the invention.

In addition, comparison of the Ge/Ga As heterostructure with the $Ga_xIn_{1-x}As$/In P heterostructure (according to the invention) shows the following advantage of the heterostructure according to the invention:

the concordance of the crystal lattices of the two paired materials, which is perfect in the case of the alloy $Ga_{0.47}In_{0.53}As$ and still very good for alloys of similar composition;

better heat dissipation of the structure as a whole.

What we claim is:

1. An avalanche diode formed by a heterojunction between a ternary alloy of gallium, indium and arsenic and a binary alloy of indium and phosphorus, comprising a first layer of heavily doped ternary alloy having a first conductivity type, a second layer of weakly doped ternary alloy having a second conductivity type opposite to said first type, a third layer of weakly doped binary alloy having said second conductivity type and a substrate of heavily doped binary alloy having said second conductivity type.

2. An avalanche diode as claimed in claim 1, wherein said ternary alloy corresponds to the formula $Ga_xIn_{1-x}As$ ($0.4 < X < 0.7$) and said binary alloy corresponds to the formula In P.

3. An avalanche diode as claimed in claim 2, wherein the parameter x is substantially 0.47.

4. An avalanche diode as claimed in claim 1, wherein said first layer is p+-doped, said second layer is n-doped, said third layer is n-doped and said substrate is n+-doped.

5. An avalanche diode as claimed in claim 4, wherein the doping levels, expressed as the number of atoms of doping impurities per cubic centimeter, are respectively of the order of $10^{18}$ for the first layer, $10^{16}$ for the second layer, $10^{15}$ for the third layer and $10^{18}$ for the substrate.

6. An avalanche diode as claimed in claim 5, wherein the thicknesses in micrometers and the doping levels in at/cc are respectively:

0.5 and $4.10^{18}$ for the first layer;
0.5 and $3.10^{16}$ for the second layer;
4 and $2.10^{15}$ for the third layer;
from 150 to 300 and $4.10^{18}$ for the substrate.

7. A transit-time oscillator, comprising an avalanche diode as claimed in claim 1.

* * * * *